United States Patent
Lee (10) Patent No.: US 9,533,598 B2
(45) Date of Patent: Jan. 3, 2017

(54) METHOD FOR BATTERY STATE OF CHARGE ESTIMATION

(71) Applicant: FORD GLOBAL TECHNOLOGIES, LLC, Dearborn, MI (US)

(72) Inventor: Tae-Kyung Lee, Ann Arbor, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 35 days.

(21) Appl. No.: 14/473,286

(22) Filed: Aug. 29, 2014

(65) Prior Publication Data

US 2016/0059727 A1 Mar. 3, 2016

(51) Int. Cl.

| | |
|---|---|
| *B60L 9/00* | (2006.01) |
| *B60L 11/00* | (2006.01) |
| *G05D 1/00* | (2006.01) |
| *G05D 3/00* | (2006.01) |
| *G06F 7/00* | (2006.01) |
| *G06F 17/00* | (2006.01) |
| *B60L 11/18* | (2006.01) |
| *H02J 7/00* | (2006.01) |

(52) U.S. Cl.
CPC ........ *B60L 11/1861* (2013.01); *B60L 11/1816* (2013.01); *B60L 11/1864* (2013.01); *H02J 7/0014* (2013.01); *Y10S 903/903* (2013.01)

(58) Field of Classification Search
CPC .............. G01R 31/3606; G01R 31/362; G01R 31/3624; G01R 31/3679; H02J 2007/005; H02J 7/00; B60K 6/28
See application file for complete search history.

(56) References Cited

U.S. PATENT DOCUMENTS

| | | | |
|---|---|---|---|
| 6,473,330 B1 * | 10/2002 | Ogiwara | ................. G11C 11/22 365/145 |
| 6,529,840 B1 | 3/2003 | Hing | |
| 6,534,954 B1 | 3/2003 | Plett | |

(Continued)

OTHER PUBLICATIONS

Enhanced Model for Lithium-Polymer Cells including Temperature Effects Baronti et al. University of Pisa, Italy (published in 2010) http://ieeexplore.ieee.org/stamp/stamp.jsp?tp=&arnumber=5675134.*

(Continued)

*Primary Examiner* — John R Olszewski
*Assistant Examiner* — Tommy Worden
(74) *Attorney, Agent, or Firm* — David Kelley; Brooks Kushman P.C.

(57) ABSTRACT

A battery management system includes at least one controller programmed to, in response to a battery current becoming approximately zero, output an open-circuit voltage based on a sequence of battery terminal voltages measured during a time interval in which the battery current remains approximately zero and while a charge polarization voltage is decreasing. The open-circuit voltage may be further based on a non-linear regression of the sequence of battery terminal voltages. The non-linear regression may minimize a mean-squared error between the battery terminal voltages and corresponding battery terminal voltage estimates. The at least one controller may command the battery current to zero for the time interval. The battery management system may be included in a vehicle with a traction battery.

7 Claims, 5 Drawing Sheets

(56) References Cited

U.S. PATENT DOCUMENTS

| | | | |
|---|---|---|---|
| 6,661,202 B2* | 12/2003 | Arai | G01R 31/3679 320/132 |
| 6,677,729 B2* | 1/2004 | Arai | G01R 31/3662 320/132 |
| 6,788,068 B2* | 9/2004 | Arai | G01R 31/3662 324/425 |
| 7,034,504 B2* | 4/2006 | Arai | G01R 31/3648 320/132 |
| 7,456,612 B2* | 11/2008 | Murakami | B60L 3/0046 320/132 |
| 7,557,584 B2* | 7/2009 | Murakami | G01R 31/3624 320/132 |
| 8,193,777 B2* | 6/2012 | Nakashima | H01M 2/16 320/141 |
| 8,207,706 B2 | 6/2012 | Ishikawa | |
| 8,264,202 B2 | 9/2012 | Sahu et al. | |
| 8,380,452 B2* | 2/2013 | Maegawa | G01R 31/3658 320/134 |
| 8,648,570 B2* | 2/2014 | Lim | 320/118 |
| 2002/0145430 A1* | 10/2002 | Arai | B60K 6/22 324/426 |
| 2002/0186019 A1* | 12/2002 | Arai | G01R 31/3662 324/525 |
| 2003/0025506 A1* | 2/2003 | Arai | G01R 31/3679 324/426 |
| 2003/0025507 A1* | 2/2003 | Arai | G01R 31/3662 324/427 |
| 2003/0097225 A1* | 5/2003 | Teruo | G01R 31/3624 702/63 |
| 2003/0210056 A1* | 11/2003 | Arai | G01R 31/3648 324/430 |
| 2004/0257087 A1* | 12/2004 | Murakami | B60L 3/0046 324/426 |
| 2005/0231164 A1 | 10/2005 | Melichar | |
| 2007/0096743 A1* | 5/2007 | Arai | G01R 31/3679 324/426 |
| 2009/0256528 A1 | 10/2009 | Greening et al. | |
| 2010/0250163 A1* | 9/2010 | Maegawa | G01R 31/3658 702/63 |
| 2010/0274510 A1 | 10/2010 | Morrison et al. | |
| 2010/0277123 A1* | 11/2010 | Lim | H02J 7/0016 320/116 |
| 2011/0298624 A1 | 12/2011 | Bauman et al. | |
| 2012/0072145 A1 | 3/2012 | Zhang et al. | |
| 2012/0105068 A1 | 5/2012 | Wang et al. | |
| 2012/0105069 A1 | 5/2012 | Wang et al. | |
| 2012/0150464 A1 | 6/2012 | Swanton | |
| 2012/0200264 A1* | 8/2012 | Choi | H02J 3/32 320/132 |
| 2012/0310568 A1 | 12/2012 | Wang et al. | |
| 2013/0006454 A1 | 1/2013 | Li et al. | |
| 2013/0138370 A1 | 5/2013 | Oh et al. | |

OTHER PUBLICATIONS

State of Charge (SOC) Determination MPower Custom Power Solutions Wayback Machine Archived on May 9, 2008 https://web.archive.org/web/20080509145838/http://www.mpoweruk.com/soc.htm.*

A survey of mathematics-based equivalent-circuit and electrochemical battery models for hybrid and electric vehicle simulation Seaman et al. Journal of Power Sources vol. 256, Jun. 15, 2014, pp. 410-423 http://www.sciencedirect.com/science/article/pii/S0378775314000810.*

* cited by examiner

METHOD FOR BATTERY STATE OF CHARGE ESTIMATION

TECHNICAL FIELD

This application generally relates to state of charge estimation for a vehicle battery.

BACKGROUND

Hybrid and electric vehicles include a traction battery comprised of a number of cells. Traction batteries store energy and provide power to electric machines for propulsion and other functions. A battery control system may monitor the operation of the traction battery and may control the traction battery based on a variety of inputs. A useful value for the battery control system is the battery state of charge (SOC). Battery SOC is an estimate of the amount of energy remaining in the traction battery. The SOC may be derived from an integration of a battery current. Integration of the battery current requires the use of high accuracy current sensors because even small measurement errors will be integrated over a long period of time. It may be beneficial to determine SOC in an alternate way.

SUMMARY

A battery management system includes at least one controller programmed to, in response to a battery current becoming approximately zero, output an open-circuit voltage based on a sequence of battery terminal voltages measured during a time interval in which the battery current remains approximately zero and a charge polarization voltage is decreasing. The open-circuit voltage may be further based on a non-linear regression of the sequence of battery terminal voltages. The non-linear regression may minimize a mean-squared error between the battery terminal voltages and corresponding battery terminal voltage estimates. The open-circuit voltage may be bounded by a minimum voltage and a maximum voltage. The at least one controller may be further programmed to output a state of charge of a battery based on the open-circuit voltage. The at least one controller may be further programmed to operate the battery according to the open-circuit voltage. The at least one controller may be further programmed to command the battery current to zero for the time interval.

A vehicle includes a traction battery and at least one controller. The at least one controller is programmed to, in response to a battery current becoming approximately zero and remaining approximately zero for a time interval lasting at least until a magnitude of a battery terminal voltage gradient is less than a predetermined value, output an open-circuit voltage based on a sequence of battery terminal voltages measured during the time interval and operate the traction battery according to the open-circuit voltage. The at least one controller may be further programmed to command the battery current to zero for the time interval. The open circuit voltage may be further based on a non-linear regression of the sequence of battery terminal voltages. The non-linear regression may minimize a mean-squared error between the battery terminal voltages and corresponding battery terminal voltage estimates. The at least one controller may be further programmed to output a state of charge based on the open-circuit voltage. The at least one controller may be further programmed to output a charge polarization voltage estimate associated with a time at which the battery current becomes approximately zero. The open-circuit voltage may be limited to be between a maximum voltage and a minimum voltage.

A method for operating a traction battery includes outputting, by a controller, an open-circuit voltage based on a sequence of battery terminal voltages measured during a time interval after which a battery current becomes approximately zero and remains approximately zero for the time interval. The method further includes operating, by the controller, the traction battery according to the open-circuit voltage. The open-circuit voltage may be further based on a non-linear regression of the sequence of battery terminal voltages. The non-linear regression may minimize a mean-squared error between the battery terminal voltages and corresponding battery terminal voltage estimates. The method may further comprise commanding, by the controller, the battery current to approximately zero for the time interval. The method may further comprise outputting, by the controller, a state of charge of the battery based on the open-circuit voltage and operating the battery according to the state of charge. The time interval may be an amount of time between the battery current becoming zero and a magnitude of a battery terminal voltage gradient becoming less than a predetermined threshold.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
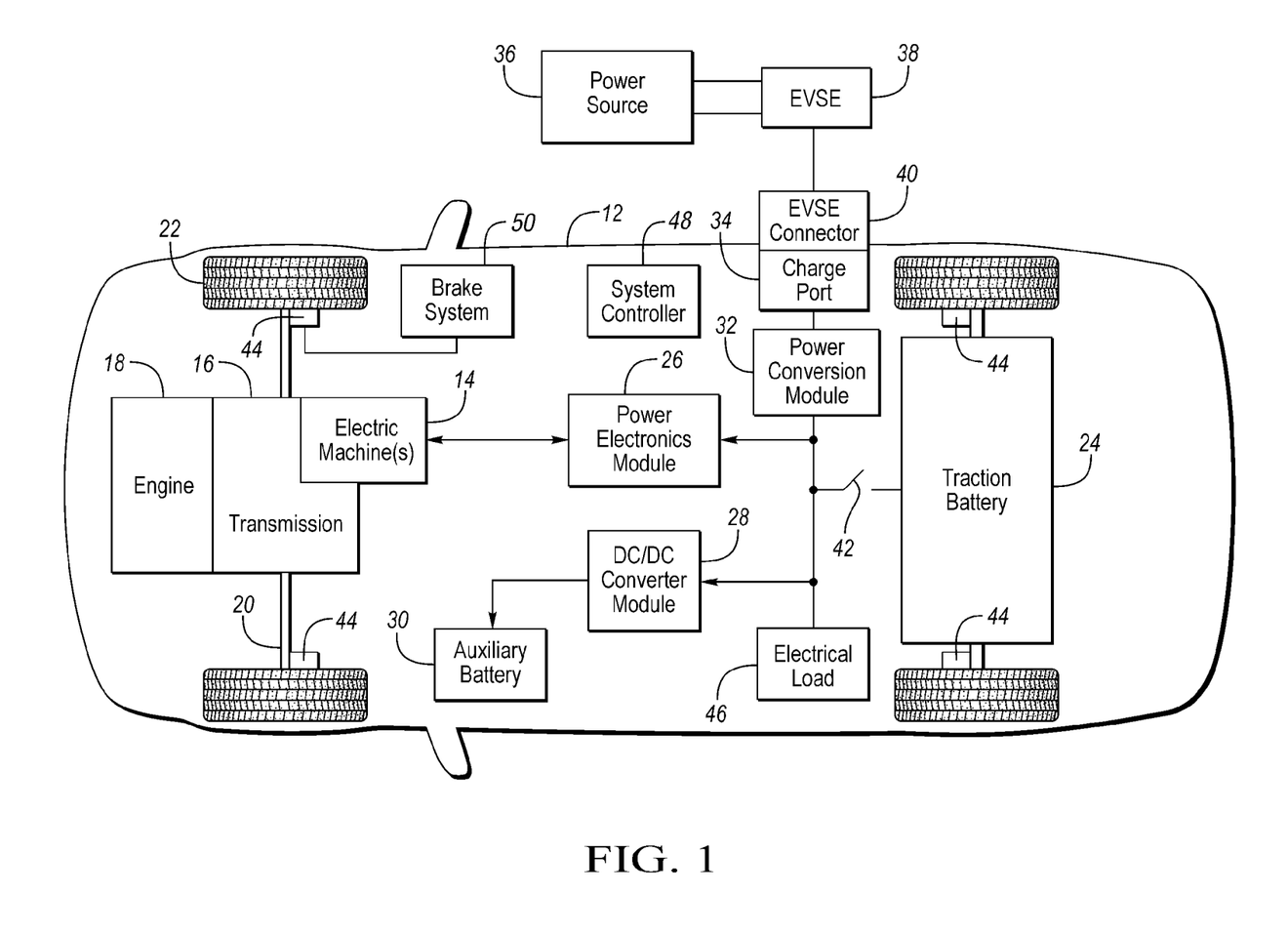
FIG. 1 is a diagram of a hybrid vehicle illustrating typical drivetrain and energy storage components.

FIG. 1 depicts a typical plug-in hybrid-electric vehicle (PHEV). A typical plug-in hybrid-electric vehicle 12 may comprise one or more electric machines 14 mechanically connected to a hybrid transmission 16. The electric machines 14 may be capable of operating as a motor or a generator. In addition, the hybrid transmission 16 is mechanically connected to an engine 18. The hybrid transmission 16 is also mechanically connected to a drive shaft 20 that is mechanically connected to the wheels 22. The electric machines 14 can provide propulsion and deceleration capability when the engine 18 is turned on or off. The electric machines 14 also act as generators and can provide fuel economy benefits by recovering energy that would normally be lost as heat in the friction braking system. The electric machines 14 may also reduce vehicle emissions by allowing the engine 18 to operate at more efficient speeds and allowing the hybrid-electric vehicle 12 to be operated in electric mode with the engine 18 off under certain conditions.

A traction battery or battery pack 24 stores energy that can be used by the electric machines 14. A vehicle battery pack 24 typically provides a high voltage DC output. The traction battery 24 is electrically connected to one or more power electronics modules 26. One or more contactors 42 may isolate the traction battery 24 from other components when opened and connect the traction battery 24 to other components when closed. The power electronics module 26 is also electrically connected to the electric machines 14 and provides the ability to bi-directionally transfer energy between the traction battery 24 and the electric machines 14. For example, a typical traction battery 24 may provide a DC voltage while the electric machines 14 may operate using a three-phase AC current. The power electronics module 26 may convert the DC voltage to a three-phase AC current for use by the electric machines 14. In a regenerative mode, the power electronics module 26 may convert the three-phase AC current from the electric machines 14 acting as generators to the DC voltage compatible with the traction battery 24. The description herein is equally applicable to a pure electric vehicle. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A typical system may include a DC/DC converter module 28 that converts the high voltage DC output of the traction battery 24 to a low voltage DC supply that is compatible with other vehicle loads. Other high-voltage loads 46, such as compressors and electric heaters, may be connected directly to the high-voltage without the use of a DC/DC converter module 28. The low-voltage systems may be electrically connected to an auxiliary battery 30 (e.g., 12V battery).

The vehicle 12 may be an electric vehicle or a plug-in hybrid vehicle in which the traction battery 24 may be recharged by an external power source 36. The external power source 36 may be a connection to an electrical outlet that receives utility power. The external power source 36 may be electrically connected to electric vehicle supply equipment (EVSE) 38. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34. Alternatively, various components described as being electrically connected may transfer power using a wireless inductive coupling.

One or more wheel brakes 44 may be provided for decelerating the vehicle 12 and preventing motion of the vehicle 12. The wheel brakes 44 may be hydraulically actuated, electrically actuated, or some combination thereof. The wheel brakes 44 may be a part of a brake system 50. The brake system 50 may include other components to operate the wheel brakes 44. For simplicity, the figure depicts a single connection between the brake system 50 and one of the wheel brakes 44. A connection between the brake system 50 and the other wheel brakes 44 is implied. The brake system 50 may include a controller to monitor and coordinate the brake system 50. The brake system 50 may monitor the brake components and control the wheel brakes 44 for vehicle deceleration. The brake system 50 may respond to driver commands and may also operate autonomously to implement features such as stability control. The controller of the brake system 50 may implement a method of applying a requested brake force when requested by another controller or sub-function.

One or more electrical loads 46 may be connected to the high-voltage bus. The electrical loads 46 may have an associated controller that operates and controls the electrical loads 46 when appropriate. Examples of electrical loads 46 may be a heating module or an air-conditioning module.

The various components discussed may have one or more associated controllers to control and monitor the operation of the components. The controllers may communicate via a serial bus (e.g., Controller Area Network (CAN)) or via discrete conductors. A system controller 48 may be present to coordinate the operation of the various components.

Figure 2:
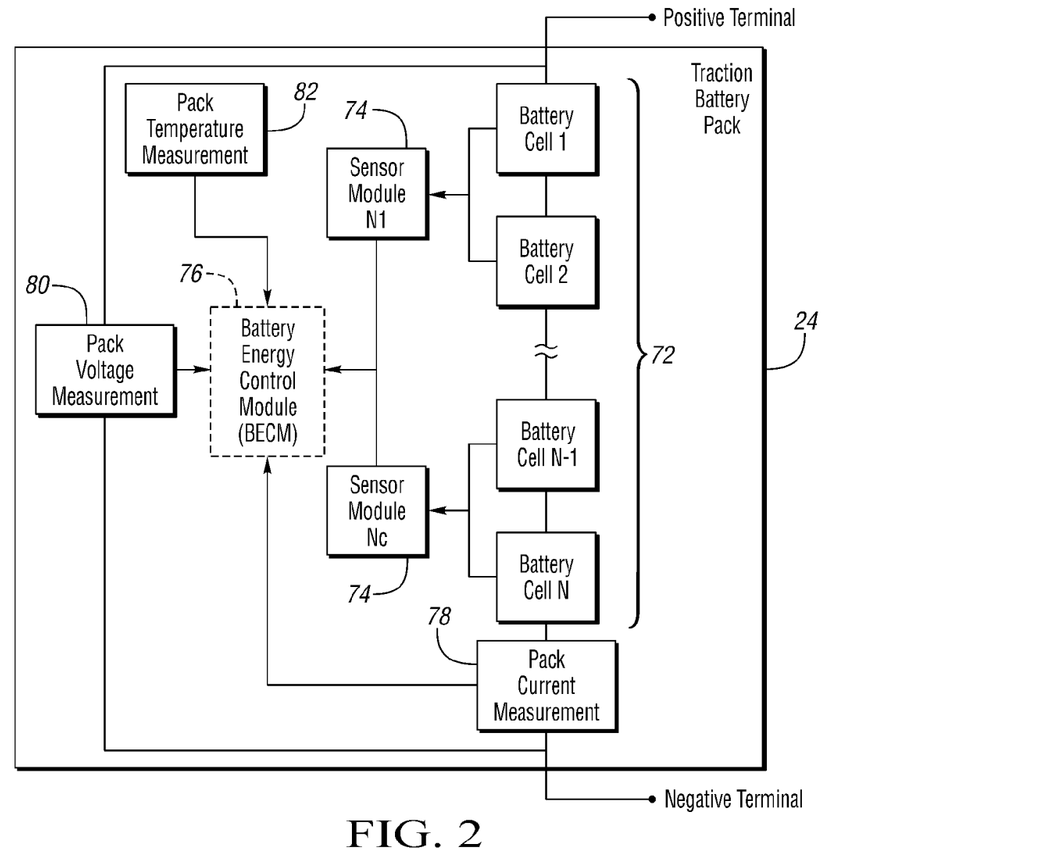
FIG. 2 is a diagram of a possible battery pack arrangement comprised of multiple cells, and monitored and controlled by a Battery Energy Control Module.

A traction battery 24 may be constructed from a variety of chemical formulations. Typical battery pack chemistries may be lead acid, nickel-metal hydride (NIMH) or Lithium-Ion. FIG. 2 shows a typical traction battery pack 24 in a series configuration of N battery cells 72. Other battery packs 24, however, may be composed of any number of individual battery cells connected in series or parallel or some combination thereof. A battery system may have a one or more controllers, such as a Battery Energy Control Module (BECM) 76 that monitors and controls the performance of the traction battery 24. The BECM 76 may include sensors and circuitry to monitor several battery pack level characteristics such as pack current 78, pack voltage 80 and pack temperature 82. The BECM 76 may have non-volatile memory such that data may be retained when the BECM 76 is in an off condition. Retained data may be available upon the next key cycle.

In addition to the pack level characteristics, there may be battery cell 72 level characteristics that are measured and monitored. For example, the terminal voltage, current, and temperature of each cell 72 may be measured. A system may use a sensor module 74 to measure the battery cell 72 characteristics. Depending on the capabilities, the sensor module 74 may include sensors and circuitry to measure the characteristics of one or multiple of the battery cells 72. The battery pack 24 may utilize up to $N_c$ sensor modules 74 to measure the characteristics of all the battery cells 72. Each sensor module 74 may transfer the measurements to the BECM 76 for further processing and coordination. The sensor module 74 may transfer signals in analog or digital form to the BECM 76. In some embodiments, the sensor module 74 functionality may be incorporated internally to the BECM 76. That is, the sensor module 74 hardware may be integrated as part of the circuitry in the BECM 76 and the BECM 76 may handle the processing of raw signals.

Battery pack state of charge (SOC) gives an indication of how much charge remains in the battery pack. The battery pack SOC may be output to inform the driver of how much charge remains in the battery pack, similar to a fuel gauge. The battery pack SOC may also be used to control the operation of an electric or hybrid-electric vehicle. Calculation of battery pack SOC can be accomplished by a variety of methods. One possible method of calculating battery SOC is to perform an integration of the battery pack current over time. This is well-known in the art as ampere-hour integration.

Figure 3:
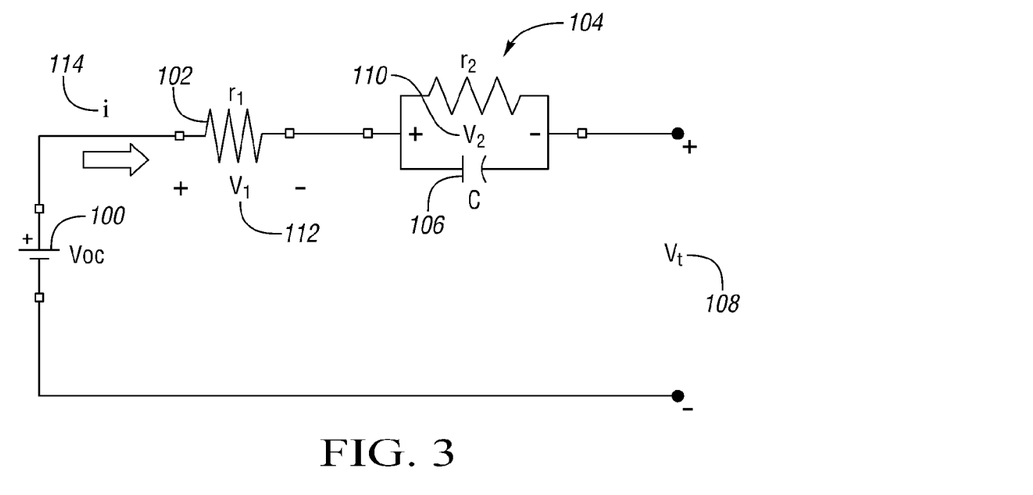
FIG. 3 is a diagram of an example battery cell equivalent circuit.

A battery cell may be modeled as a circuit. FIG. 3 shows one possible battery cell equivalent circuit model (ECM). A battery cell may be modeled as a voltage source ($V_{oc}$) 100 having associated resistances (102 and 104) and capacitance 106. $V_{oc}$ 100 represents the open-circuit voltage of the battery. The model includes an internal resistance, $r_1$ 102, a charge transfer resistance, $r_2$ 104, and a double layer capacitance, C 106. The voltage $V_1$ 112 is the voltage drop across the internal resistance 102 due to current 114 flowing through the circuit. The voltage $V_2$ 110 is the voltage drop across the parallel combination of $r_2$ 104 and C 106 due to current 114 flowing through the combination. The voltage $V_t$ 108 is the voltage across the terminals of the battery (terminal voltage). The voltage $V_2$ 110 may model a charge polarization voltage of the battery.

Because of the battery cell impedance, the terminal voltage, $V_t$ 108, may not be the same as the open-circuit voltage, $V_{oc}$ 100. The open-circuit voltage, $V_{oc}$ 100, may not be readily measurable as only the terminal voltage 108 of the battery cell is accessible for measurement. When no current 114 is flowing for a sufficiently long period of time, the terminal voltage 108 may be the same as the open-circuit voltage 100. Upon discontinuing the current 114, the terminal voltage 108 may relax or decay to the open-circuit voltage 100 over a period of time as modeled by the capacitive element. In a steady-state condition in which the current 114 is constant, the impedance may be modeled as the sum of the resistive elements $r_1$ 102 and $r_2$ 104. When current 114 is flowing, $V_{oc}$ 100 may not be readily measurable and the value may need to be inferred based on the circuit model. The parameter values $r_1$ 102, $r_2$ 104, and C 106 may be known or unknown. The value of the parameters may depend on the battery chemistry. Other battery models are possible and the methods described are not dependent upon the model that is chosen.

During charging, a charging voltage may be applied to the battery terminals 108. Current 114 may flow through the battery based on the resistance 112 and the open-circuit voltage 100. During charging, the terminal voltage 108 may be greater than the open-circuit voltage 100. During discharge, the terminal voltage 108 may be less than the open-circuit voltage 100.

Based on the ECM, the battery may be modeled by following equations:

$$\dot{V}_2 = -\frac{1}{r_2 C} V_2 + \frac{1}{C} i \qquad (1)$$

$$V_t = V_{oc} - V_2 - r_1 i \qquad (2)$$

The differential equation may be solved about a present operating point of the battery. Solving about the present operating point results in the following:

$$V_2 = V_{2,0} e^{-\frac{1}{r_2 C} t} + \left(1 - e^{-\frac{1}{r_2 C} t}\right) r_2 i \qquad (3)$$

$$V_t = V_{oc} - V_{2,0} e^{-\frac{1}{r_2 C} t} - \left(r_1 + \left(1 - e^{-\frac{1}{r_2 C} t}\right) r_2\right) i \qquad (4)$$

where $V_{2,0}$ is the present voltage across the parallel resistor, $r_2$, and capacitor, C.

To estimate the open-circuit voltage 100, the battery current 114 may be set to zero. The battery terminal voltage 108 may then be measured. Over time, the terminal voltage 108 will converge to the open-circuit voltage 100. From the above equations, when battery current 114 is zero, the equations become:

$$V_t = V_{oc} - V_{2,0} e^{-\frac{1}{r_2 C} t} \qquad (5)$$

By letting $\tau = r_2 C$, the equation becomes:

$$V_t = V_{oc} - V_{2,0} e^{-\frac{1}{\tau} t} \qquad (6)$$

Over time, the exponential term decreases and approach zero. The exponential term may represent the charge polarization voltage (e.g., $V_2$ 110) which decreases over time when battery current 114 is zero. A sequence of terminal voltage data may be measured while battery current 114 is zero. Starting from a time zero, a sequence of n points may be obtained. The sequence may include n time and terminal voltage pairs as follows:

$$(t_1, V_{t,1}), (t_2, V_{t,2}), \ldots, (t_j, V_{t,j}), \ldots, (t_n, V_{t,n}) \qquad (7)$$

The amount of time between the voltage measurements may be a predetermined sampling time. The terminal voltages may also be sampled at a variable rate such that the time between samples is a variable time.

The unknown parameters in equation (6) are $V_{oc}$, $V_{2,0}$, and $\tau$. Based on the sequence of terminal voltages, the unknown parameters may be identified using a non-linear regression method. The parameters may be solved using the following expression:

$$\min_{V_{oc}, V_{2,0}, \tau} \sum_{j=1}^{n} (v_{t,j} - \hat{v}_{t,j})^2 / n \qquad (8)$$

subject to:

$$V_{t,j} = V_{oc} - V_{2,0} e^{-\frac{1}{\tau} t_j} \quad j = 1, \ldots, n \qquad (9)$$

$$V_{oc} \in [V_{oc,min} \; V_{oc,max}] \qquad (10)$$

The non-linear regression may estimate values for the parameters $V_{oc}$, $V_{2,0}$, and $\tau$ based on the sequence of battery terminal voltage data. The minimization used in equation (8) defines a mean-squared error minimization function. The non-linear regression may also be operated with other choices of minimization functions. The controller 76 may output the value of $V_{oc}$, $V_{2,0}$, and $\tau$. The value of $V_{2,0}$ may represent the charge polarization voltage at the time at which battery current 114 becomes approximately zero. The value of $\tau$ may represent a time constant of the battery and may describe the dynamic response of the battery to changes in current.

The minimization function is a summation of error terms squared. The error terms are based on a difference between each of the voltage data points of the sequence and an associated voltage estimate. The final summation is divided by the number of data points to give the mean value.

Figure 4:
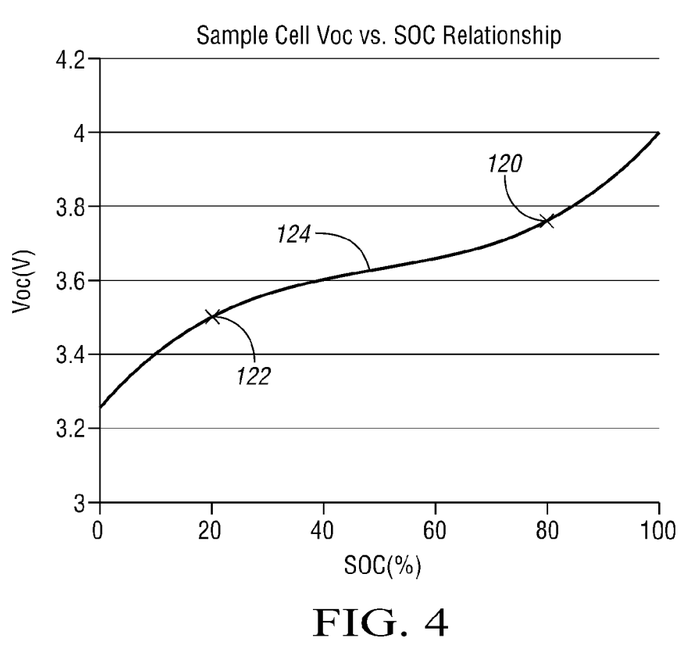
FIG. 4 is a graph that illustrates a possible open-circuit voltage (Voc) vs. battery state of charge (SOC) relationship for a typical battery cell.

Once $V_{oc}$ is estimated, the battery SOC may be estimated. For a typical Lithium-Ion battery cell, there is a relationship between SOC and the open-circuit voltage ($V_{oc}$) such that $V_{oc}=f(SOC)$. FIG. 4 shows an example curve 124 showing the open-circuit voltage $V_{oc}$ as a function of SOC. The relationship between SOC and $V_{oc}$ may be determined from an analysis of battery properties or from testing the battery cells. The function may be such that SOC may be calculated as $f^{-1}(V_{oc})$. The function or the inverse function may be implemented as a table lookup or an equivalent equation. The exact shape of the curve 124 may vary based on the exact formulation of the Lithium-Ion battery. The voltage $V_{oc}$ changes as a result of charging and discharging of the battery. Note that the curve may vary based on the battery chemistry. For example, the voltage associated with 100% SOC may change for different battery chemistries. The OCV/SOC characteristic may be dependent upon the battery temperature and may be depicted as a series of curves for different temperatures.

As seen in FIG. 4, as the SOC increases, the open-circuit voltage generally increases as well. As the battery is charged, the SOC increases and the open-circuit voltage rises. The rate of voltage increase may depend on the state of charge. For example, the slope at different points on the curve (e.g., 120 and 122) may be different.

The estimation scheme described herein may be triggered by battery current being zero. The battery current may be actively commanded to zero under certain conditions in order to initiate an estimate. One condition may be that a predetermined amount of time has passed since the last estimate was performed. The estimate may also be triggered opportunistically when battery current is zero during normal operation.

An advantage of the SOC estimation described herein is that the model considers the battery voltage dynamics. The estimation works at any operating point and the estimate is based on the present operating point. That is, current may be set to zero at any operating point and the estimation scheme can provide an accurate result. The estimation is not dependent on the battery current measurement; therefore, the estimation is independent of the current sensor accuracy. The estimation may be used in conjunction with the current integration estimate by periodically adjusting the SOC to the estimated value.

Additionally, the estimation described does not require any calibration. The parameters are estimated based on the terminal voltage response when current is set to zero. This results in a reduced modeling effort.

Figure 5A:
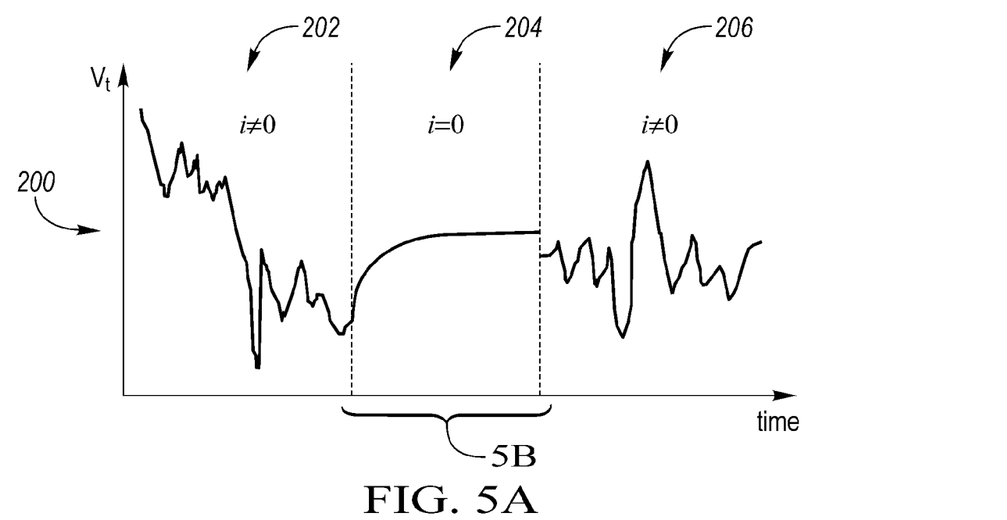
FIG. 5A is a graph that illustrates a possible battery voltage profile over time.

FIG. 5A depicts a graph 200 of a possible battery terminal voltage profile over time. During a first time interval 202, the battery current is operating at non-zero values. The value of the battery terminal voltage may change based on the current. During a second time interval 204, the battery current is zero. During a third time interval 206, the battery current is again non-zero. During the second time interval 204 in which battery current is zero, the terminal voltage will rise or decay towards the open-circuit voltage. A non-zero battery current includes charging and discharging battery currents.

Figure 5B:
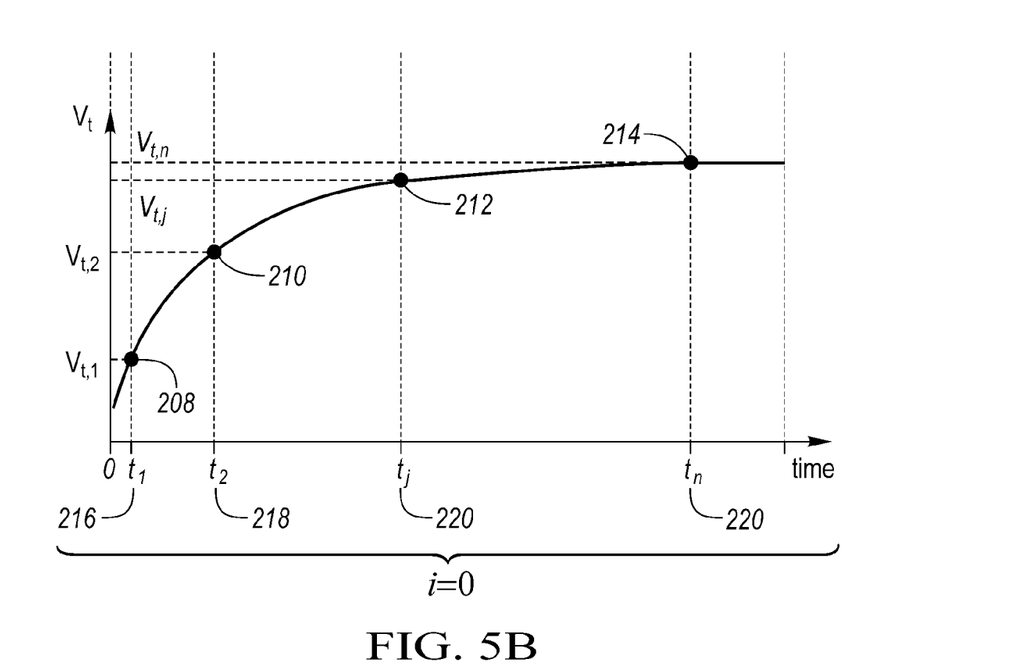
FIG. 5B is a graph that illustrates a selected time interval of FIG. 5A in which battery current is approximately zero.

FIG. 5B depicts the time interval from FIG. 5A in which the battery current is approximately zero. The situation depicted is one in which the terminal voltage rises toward the open-circuit voltage. The terminal voltage may rise toward the open-circuit under conditions in which current is being supplied by the battery (discharging) before the zero battery current occurs. An alternative situation that is not depicted is one in which the terminal voltage decays toward the open-circuit voltage. The terminal voltage may decay under conditions in which current is supplied to the battery (charging) before the zero battery current occurs.

During the time in which the battery current is zero, the terminal voltage may be measured by the controller 76. The controller 76 may also measure the battery current. When the battery current is detected to be approximately zero, a timer may be reset to zero. The timer may be incremented while the battery current remains approximately zero. While the battery current remains at zero, the controller 76 may measure the terminal voltage at various times. For example, at time $t_1$ 216, the battery terminal voltage may be measured as $v_{t,1}$ 208. The time $t_1$ 216 may be obtained by sampling the timer that is incrementing during this interval at the time when the measurement is made. At a later time, $t_2$ 218, the battery terminal voltage may be sampled again to yield a voltage $v_{t,2}$ 210.

In general, during the interval 204 in which battery current is zero, the terminal voltage may be measured. At time $t_j$ 220, the voltage may be measured as $v_{t,j}$ 212. At a time $t_n$ 220, a final battery terminal voltage may provide a voltage value of $v_{t,n}$ 214. The number of measurements, n, may vary during the interval in which battery current is zero. Note that there may be more battery terminal voltage measurements between $t_2$ and $t_j$ and between $t_j$ and $t_n$. The battery terminal voltage measurements may or may not be equally spaced in time. The first terminal voltage measurement may correspond with the time at which the battery current becomes zero.

The time interval for measuring the terminal voltages may be a predetermined fixed interval. The time interval may also vary based on characteristics of the terminal voltage response. The time interval may be sufficient when a battery terminal voltage gradient is less than a predetermined value. The time interval may be sufficient when the charge polarization voltage stops decreasing or has reached a stable condition.

The controller may then determine whether or not enough terminal voltage samples are available to perform the non-linear regression. During short time intervals, a sufficient number of measurements may not be obtained to achieve accurate results from the non-linear regression. A system that actively sets the current to zero may be able to control the time interval to ensure that a sufficient number of samples are available. The controller may also monitor a gradient of the terminal voltage. When the magnitude of the gradient is less than a predetermined threshold, the non-linear regression may be performed. This may ensure that the dynamic response of the terminal voltage is captured in the measured data.

When a sufficient number of battery terminal voltage and time pairs are available, the non-linear regression may be performed. The parameters may be calculated. The open-circuit voltage estimate may be used to determine the SOC of the battery.

Figure 6:
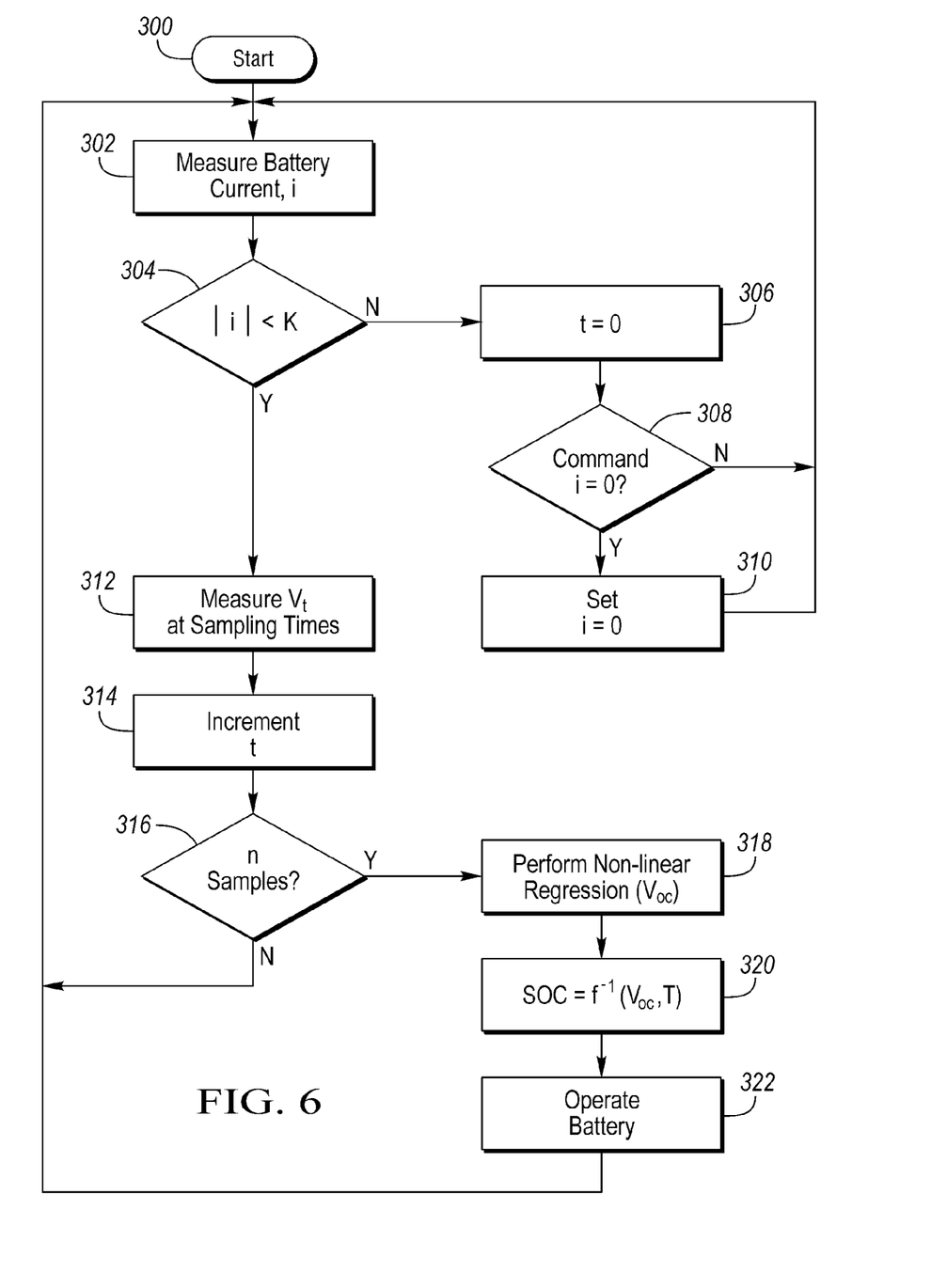
FIG. 6 is a flowchart depicting a possible set of operations for calculating an open-circuit voltage of a battery.

FIG. 6 depicts one possible flowchart including instructions that may be implemented in a controller 76. After startup 300, operation 302 may be performed to measure the battery current. Decision operation 304 may be implemented to determine if the magnitude of the current is less than a threshold, K. The threshold K may be a value that is near zero such that values below the threshold may be considered to be approximately zero. If the result of decision operation 304 is negative, then operations 306 through 308 may be performed. Operation 306 resets a timer to zero. Decision operation 308 checks if the controller 76 should command the battery current to zero. If the result of decision operation 308 is positive, operation 310 may be performed to set the battery current to zero. If the result of decision operation 308 is negative, execution may loop back to operation 302.

If the result of decision operation 304 is positive, operations 312 through 316 may be performed. Operation 312 may be implemented to measure the battery terminal voltage at appropriate sampling times. Operation 314 may be implemented to increment the timer value. Decision operation 316 may be implemented to determine whether enough samples, n, have been taken while the battery current is near zero. If the result of decision operation 316 is negative, then execution may loop back to operation 302 to continue measurements.

If the result of decision operation 316 is positive, then operations 318 through 322 may be performed. Operation 318 may be implemented to perform the non-linear regression to calculate the parameters, including $V_{oc}$. Operation 320 may be implemented to calculate SOC as a function of $V_{oc}$ and temperature, T. Operation 322 may be implemented to operate the traction battery according to the estimated values. Execution may loop back to operation 302 to repeat the operations.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
    a battery;
    and
    a controller, coupled to sensors that periodically measure a terminal voltage and a current of the battery, programmed to, in response to the current during operation falling below a predetermined threshold for a duration lasting until the terminal voltage gradient magnitude decreases below a predetermined value, control the terminal voltage during charging to exceed an open-circuit voltage derived from a sequence of terminal voltages measured during the duration.

2. The vehicle of claim 1, wherein the controller is further programmed to command the current to be less than the predetermined threshold for the duration.

3. The vehicle of claim 1, wherein the open-circuit voltage is further based on a non-linear regression of the sequence of terminal voltages.

4. The vehicle of claim 3, wherein the non-linear regression minimizes a mean-squared error between the terminal voltages and corresponding terminal voltage estimates.

5. The vehicle of claim 1, wherein the controller is further programmed to output a state of charge of the battery based on the open-circuit voltage to a display.

6. The vehicle of claim 1, wherein the controller is further programmed to output a charge polarization voltage estimate associated with a time at which the current falls below the predetermined threshold to a memory of the controller.

7. The vehicle of claim 1, wherein the controller is further programmed to limit the open-circuit voltage to be between a maximum voltage and a minimum voltage that are based on predetermined thresholds.

* * * * *